United States Patent
Schlezinger

(10) Patent No.: US 12,135,296 B2
(45) Date of Patent: Nov. 5, 2024

(54) EDGE INSPECTION OF SILICON WAFERS BY IMAGE STACKING

(71) Applicant: Applied Materials, Inc., Santa Clara, CA (US)

(72) Inventor: Asaf Schlezinger, Modi'in (IL)

(73) Assignee: APPLIED MATERIALS, INC., Santa Clara, CA (US)

( * ) Notice: Subject to any disclaimer, the term of this patent is extended or adjusted under 35 U.S.C. 154(b) by 266 days.

(21) Appl. No.: 17/661,299

(22) Filed: Apr. 29, 2022

(65) Prior Publication Data

US 2023/0349838 A1    Nov. 2, 2023

(51) Int. Cl.
*G01N 21/95*   (2006.01)
*G06T 1/00*    (2006.01)

(52) U.S. Cl.
CPC ....... *G01N 21/9503* (2013.01); *G06T 1/0007* (2013.01)

(58) Field of Classification Search
CPC .......... G01N 21/9503; G01N 21/9501; G01N 21/6489; G01N 21/9505; G01N 2021/845; G01N 2021/8864; G01N 21/4738; G01N 21/64; G01N 21/88; G01N 21/956; G01N 21/95607; G01N 2201/0612; G06T 1/0007; G06T 2207/10016; G06T 2207/20081; G06T 2207/20084; G06T 2207/30148; G06T 7/0004; G06T 17/00; G06T 17/10; G06T 19/20; G06T 2207/10052; G06T 2219/2012; G06T 7/001; H01L 21/67288; H01L 22/20; H01L 22/12; H01L 21/00; H01L 21/67; H01L 22/10; H01L 21/67271; H01L 21/67766; H01L 31/18; H01L 21/6838; H01L 21/67173; H01L 21/67253; H01L 21/67736; H01L 21/67763; H01L 21/67769; H01L 2924/00; H01L 2924/0002; H01L 31/04
USPC .............................. 356/237.1–237.6; 382/149
See application file for complete search history.

(56) References Cited

U.S. PATENT DOCUMENTS

| | | | |
|---|---|---|---|
| 8,428,337 | B2 | 4/2013 | Chan |
| 9,341,580 | B2 | 5/2016 | Schlezinger et al. |
| 9,651,502 | B2 | 5/2017 | Chan |
| 9,754,365 | B2 | 9/2017 | Schlezinger et al. |
| 10,403,533 | B2 | 9/2019 | Stopper et al. |

(Continued)

FOREIGN PATENT DOCUMENTS

| | | | |
|---|---|---|---|
| EP | 2781912 A1 | 9/2014 | |
| WO | WO-2017074256 A1 * | 5/2017 | ............. G01N 21/88 |

OTHER PUBLICATIONS

International Search Report and written opinion dated May 26, 2023 for Application No. PCT/US2023/013043.

*Primary Examiner* — Christina A Riddle
(74) *Attorney, Agent, or Firm* — Patterson + Sheridan, LLP

(57) ABSTRACT

Embodiments described herein provide for a defect detection system and method suitable for detecting defects on an edge of a wafer. The method includes placing at least two wafers sequentially on a conveyor. Images of at least the edges of each wafer placed on the conveyor are captured and sent to a controller. A defect detection software combines the images to show the edges of the wafers in a virtual stack. The virtual stack allows for a pattern of defects to be identified. The pattern of defects in close proximity will allow for identification of the defects in the edges of the wafers.

20 Claims, 6 Drawing Sheets

(56) References Cited

U.S. PATENT DOCUMENTS

| | | |
|---|---|---|
| 10,406,562 B2 | 9/2019 | Stopper et al. |
| 10,507,991 B2 | 12/2019 | Schlezinger et al. |
| 2008/0309927 A1 | 12/2008 | Grueneberg |
| 2009/0116727 A1 | 5/2009 | Jin et al. |
| 2010/0086197 A1 | 4/2010 | Pai et al. |
| 2011/0263049 A1 | 10/2011 | Voges et al. |
| 2013/0129187 A1* | 5/2013 | Maxwell ............... G01N 21/95 382/141 |
| 2015/0243009 A1* | 8/2015 | Schlezinger ............ G06T 7/001 382/145 |
| 2015/0377796 A1* | 12/2015 | Schlezinger ...... H01L 21/67271 356/72 |
| 2017/0170041 A1 | 6/2017 | Stopper et al. |
| 2019/0337734 A1 | 11/2019 | Schlezinger et al. |

* cited by examiner

EDGE INSPECTION OF SILICON WAFERS BY IMAGE STACKING

BACKGROUND

Field

Embodiments of the present disclosure generally relate to a method and software for product inspection. Specifically, embodiments of the present disclosure relate to a defect detection system and method suitable for detecting defects on an edge of a wafer.

Description of the Related Art

Substrates, such as semiconductor wafers, are routinely inspected during processing at inspection stations to ensure compliance with predetermined quality control standards. Different inspection techniques provide comprehensive data regarding products and processes. Due to the brittle properties of wafers, a very small defect on any edge of the wafer can lead to cracks and ultimately wafer breakage. Therefore, it is beneficial to monitor the quality of wafers right from the beginning of the fabrication process in order to improve production yield and keep production costs low. However, identifying individual chips and other defects on the edges of an individual wafer can be challenging.

Therefore, there is a need for an improved method of wafer inspection.

SUMMARY

In one embodiment, a method for inspecting a wafer is provided. The method includes moving a first wafer through a metrology unit and capturing a first image of the first wafer. The first image includes a first edge of the first wafer. The method further comprises moving a second wafer through the metrology unit after the first wafer and capturing a second image of the second wafer. The second image includes a second edge of the second wafer. The method further includes combining the first image and the second image to form a virtual stack and identifying one or more defects on the first edge or the second edge.

In another embodiment, a wafer inspection system is provided. The wafer inspection system includes a first camera configured to capture an image of an edge of wafers interfacing with the first camera and a controller in communication with the first camera. The controller is configured to combine edge images of wafers obtained by the first camera to form a virtual stack, identify one or more defects on the individual wafers, and form the virtual stack based on the one or more defects.

In yet another embodiment, a non-transitory computer-readable medium is provided. The non-transitory computer-readable medium is storing instructions that, when executed by a processor coupled to an inspection system, cause the inspection system to move a first wafer through a metrology unit and capture a first image of the first wafer. The first image includes a first edge of the first wafer. The processor coupled to the inspection system further causes the inspection system to move a second wafer through the metrology unit after the first wafer and capture a second image of the second wafer. The second image includes a second edge of the second wafer. The processor coupled to the inspection system further causes the inspection system to combine the first image and the second image to form a virtual stack and identify one or more defects on the first edge or the second edge.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure relate a defect detection system and method suitable for detecting defects on an edge of a wafer. The methods of the present disclosure may be utilized for inspection of wafers; however, the inspection of other types of substrates is also contemplated. The methods of the present disclosure improve the accuracy of defect detection on edges of the wafer without sacrificing throughput. The inspection techniques described herein may also be utilized to inspect other workpieces that are imaged individually but have edge defects that are more reliably detectible by analyzing a composite image of a plurality of edge images from different workpieces stacked together.

Figure 1:
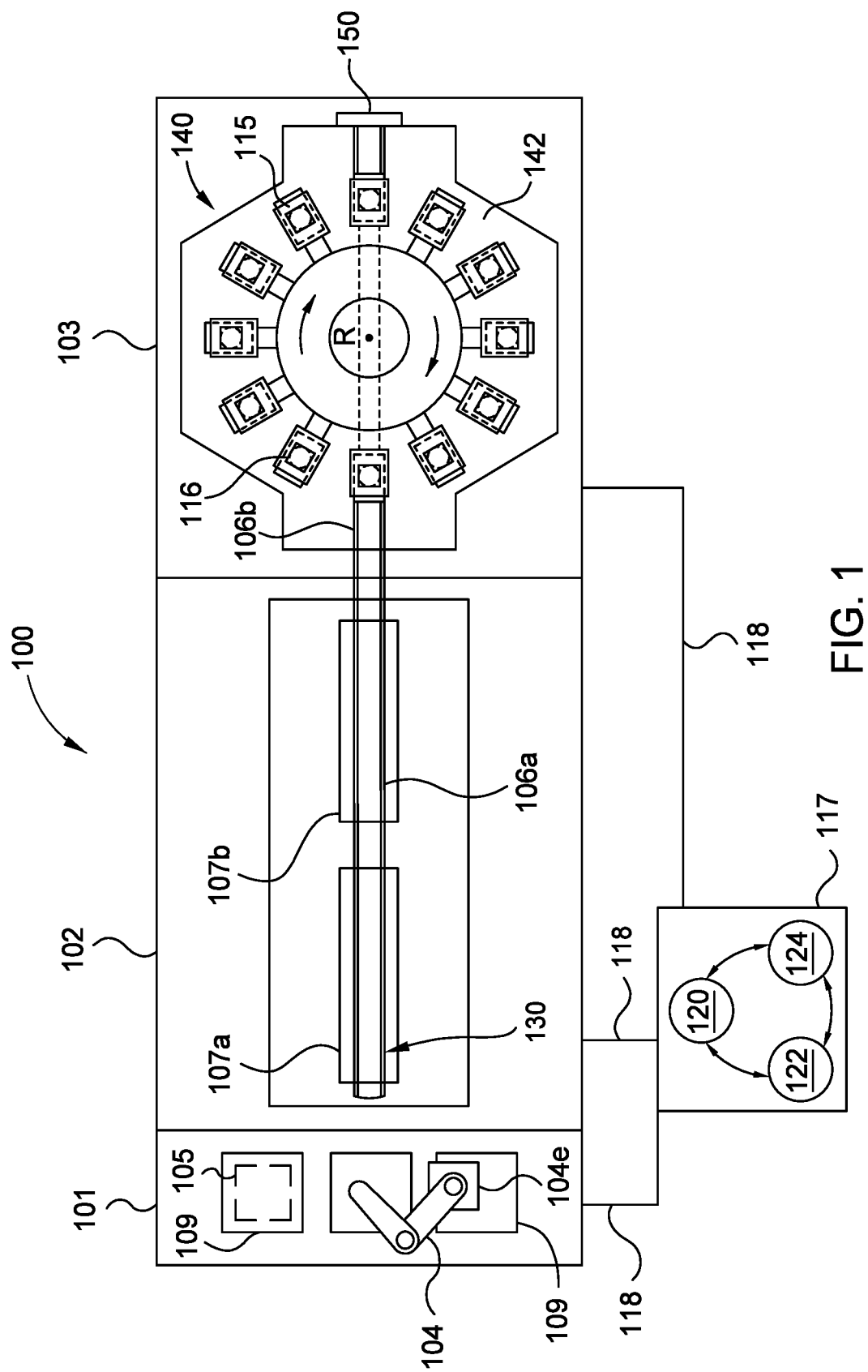
FIG. 1 is a top plan view of an inspection system, according to embodiments described herein.

FIG. 1 illustrates a top plan view of an inspection system 100, according to one embodiment. The inspection system 100 includes a front end 101, an inspection unit 102, and a sorting unit 103 disposed linearly relative to another. The front end 101 includes a transfer robot 104 having a support element 104e, such as a suction element, end effector, gripper or clamp, for gripping and transferring wafers 105. The transfer robot 104 is adapted to transfer wafers 105 from one or more cassettes 109 positioned within the front end 101 to a conveyor system 130 in the inspection unit 102. The inspection unit 102 is disposed between the front end 101 and the sorting unit 103. The inspection unit 102 is coupled to the front end 101 and the sorting unit 103. The conveyor system 130 may be a motor-driven conveyor system including one or more conveyors 106a, 106b such as belts or tracks (two are shown) driven by an actuator through rollers and/or drive gears. The conveyors 106a, 106b transfer wafers 105 received from the transfer robot 104 through the inspection unit 102 to a location within the sorting unit 103. In the embodiment shown, the conveyors 106a, 106b are disposed sufficiently close to one another to allow a wafer to bridge the gap therebetween.

Each of the inspection units 102 may include one or more metrology units. In the embodiment of FIG. 1, the inspection unit 102 includes two metrology units 107a, 107b. It is contemplated that the inspection system 100 may also be modified by adding additional metrology units to the inspection unit 102, thus increasing throughput and/or characteristics evaluated. In one example, the metrology unit 107a is micro-crack inspection unit adapted to inspect wafers 105 for cracks, chips, and other defects on the wafers 105. The metrology unit 107a is positioned adjacent to the front end 101 and is configured to accept wafers 105 positioned on the conveyor system 130 by the transfer robot 104. The wafers 105 are moved relative to the metrology unit 107a in a continuous manner as inspection, such as chip detection, occurs. In some embodiments, the metrology unit 107b is positioned before the metrology unit 107a along the conveyor 106a.

The metrology unit 107b performs one or more inspection processes on a wafer 105 as the wafer 105 is transferred relative thereto. The inspection process occurring at the metrology unit 107b is performed while the substrate is in motion; however, it is contemplated that the motion of the wafer 105 may be halted to facilitate increased accuracy of inspection. The metrology unit 107b may be a single metrology unit 107b or multiple metrology units, depending on the function of the inspection processes. The inspection processes include thickness measurement, impurity measurements (e.g., percentage of impurities), crystal dislocation measurements, analysis of the geometry and surface properties of the wafer 105, saw mark detection (e.g., saw mark depth and location), and may inspect and identify saw marks including groove, step, and double step.

The conveyor system 130 conveys the inspected wafers 105 from the inspection unit 102 to the sorting unit 103. The sorting unit 103 optionally includes a conveyor 106b disposed longitudinally therethrough. The conveyor system 130 may deliver inspected wafers 105 into the sorting unit 103 to a location within reach of a rotary sorting system 140 housed within the sorting unit 103. Additionally, the conveyor system 130 may continue through the sorting unit 103 to a connector 150. As such, an inspected wafer 105 may bypass the rotary sorting system 140 and pass to the connector 150. Furthermore, if an inspected wafer 105 is not picked up by the rotary sorting system 140, the wafer 105 may continue along the conveyor system 130 toward the connector 150. In certain embodiments the sorting unit 103 may be further coupled by the connector 150 with additional units such as, by way of example only, additional inspection systems, additional sorting units, additional metrology units, etc. via the connector 150. The connector 150 may further allow the conveyor system 130 to align with a conveyor system of an additional unit such as, by way of example only, an additional inspection system, an additional sorting unit, an additional metrology units, etc.

The rotary sorting system 140 includes a rotatable support 142 contained within the rotary sorting system 140. The rotatable support 142 has a rotational axis R. The rotatable support 142 may be a rotary disc, a circular support, a tubular structure, or any other shape for efficiently sorting wafers 105.

One or more bins 115 (twelve are shown) are disposed radially outward of the rotatable support 142. In one embodiment, by way of example only, at least ten bins 115 are utilized; however it is contemplated that any number of bins 115 may be utilized, such as, for example, six, eight, or twelve bins 115. The bins 115 are adapted to receive wafers 105 from the conveyor 106b. In one mode of operation, the rotary sorting system 140 may rotate about the rotational axis R in a stepping fashion such that the rotary sorting system 140 stops to grip (i.e., pick up) a wafer 105 from the conveyor 106b as each wafer 105 enters the sorting unit 103. The bins 115 may store the sorted wafers 105.

The wafers 105 may be sorted into the bins 115 according to characteristics determined during inspection processes performed in the metrology unit 107b. For example, the wafers 105 are sorted according to test date obtained in the metrology unit 107b. In another embodiment, the bins 115 are positioned in a rotary pattern. At least one gripper 116 is in the bins 115 so that each gripper 116 may pick the wafer 105 when the wafer 105 reaches the sorting unit 103. Each gripper 116 may be, by way of example only, a suction gripper, a claw gripper, a magnetic gripper, or a picker. In one embodiment, each gripper 116 is a Bernoulli picker. The gripper 116 picks the wafer 105 from the conveyor system 130 in a horizontal orientation, and the wafer remains in the horizontal orientation as the gripper 116 rotates in the rotational axis R.

While FIG. 1 discloses one embodiment of the inspection system 100, other embodiments are also contemplated. For example, while the conveyor system 130 includes two conveyors 106a, 106b, it is contemplated that the conveyor system 130 may include a single conveyor capable of transporting wafers 105 continuously through the inspection system 100. Alternatively, more than two conveyors 106a, 106b may be utilized. In another embodiment, it is contemplated that the metrology units 107a, 107b may be configured in a linear arrangement or operational order other than described with respect to FIG. 1. In yet another embodiment, it is contemplated that the front end may not include a robot 104. Rather, wafers 105 may be positioned on the conveyor system 130 by positioning a cassette adjacent the conveyor 106a. The cassette may then be indexed such that a substrate within the cassette contacts the conveyor 106a and is removed from the cassette onto the conveyor 106a due to relative motion therebetween. Further indexing may facilitate removal of additional substrates.

The inspection system 100 may further include a controller 117. The inspection system 100 is coupled to the controller 117 by a communication cable 118. The controller 117 is operable to control inspecting and sorting of wafers 105 within the inspection system 100. The controller 117 includes a programmable central processing unit (CPU) 120 that is operable with a memory 122 to facilitate control of the processes of handling and inspecting the substrates. The controller 117 may also include hardware for monitoring the inspection of a substrate through sensors (not shown) in the inspection system 100. To facilitate control of the inspection system 100 and processing a substrate, the CPU 120 may be one of any form of general-purpose computer processors for controlling the wafer inspection process and the wafer sorting process. The memory 122 is coupled to the CPU 120 and the memory 122 is non-transitory. Support circuits 124 are coupled to the CPU 120 for supporting the CPU 120 in a conventional manner. The process for inspecting wafers by operation of the metrology unit 107a may be stored in the memory 122. The process for inspecting wafers may also be stored and/or executed by a second CPU that is remotely located from the hardware being controlled by the CPU 120.

The memory 122 is in the form of computer-readable storage media that contains instructions, that when executed by the CPU 120, facilitates the operation of the inspection system 100. The instructions in the memory 122 are in the form of a program product such as a program that implements the operation of the inspection system 100, including for example the operation of the metrology unit 107a. The program code may conform to any one of a number of different programming languages. In one example, the disclosure may be implemented as a program product stored in computer readable storage media for use with a computer system. The program(s) of the program product define functions of the embodiments. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writing storage media on which alterable information is stored. Such computer-readable storage media, when carrying computer-readable instructions that direct the functions of the methods described herein, are embodiments of the present disclosure.

Figure 2:
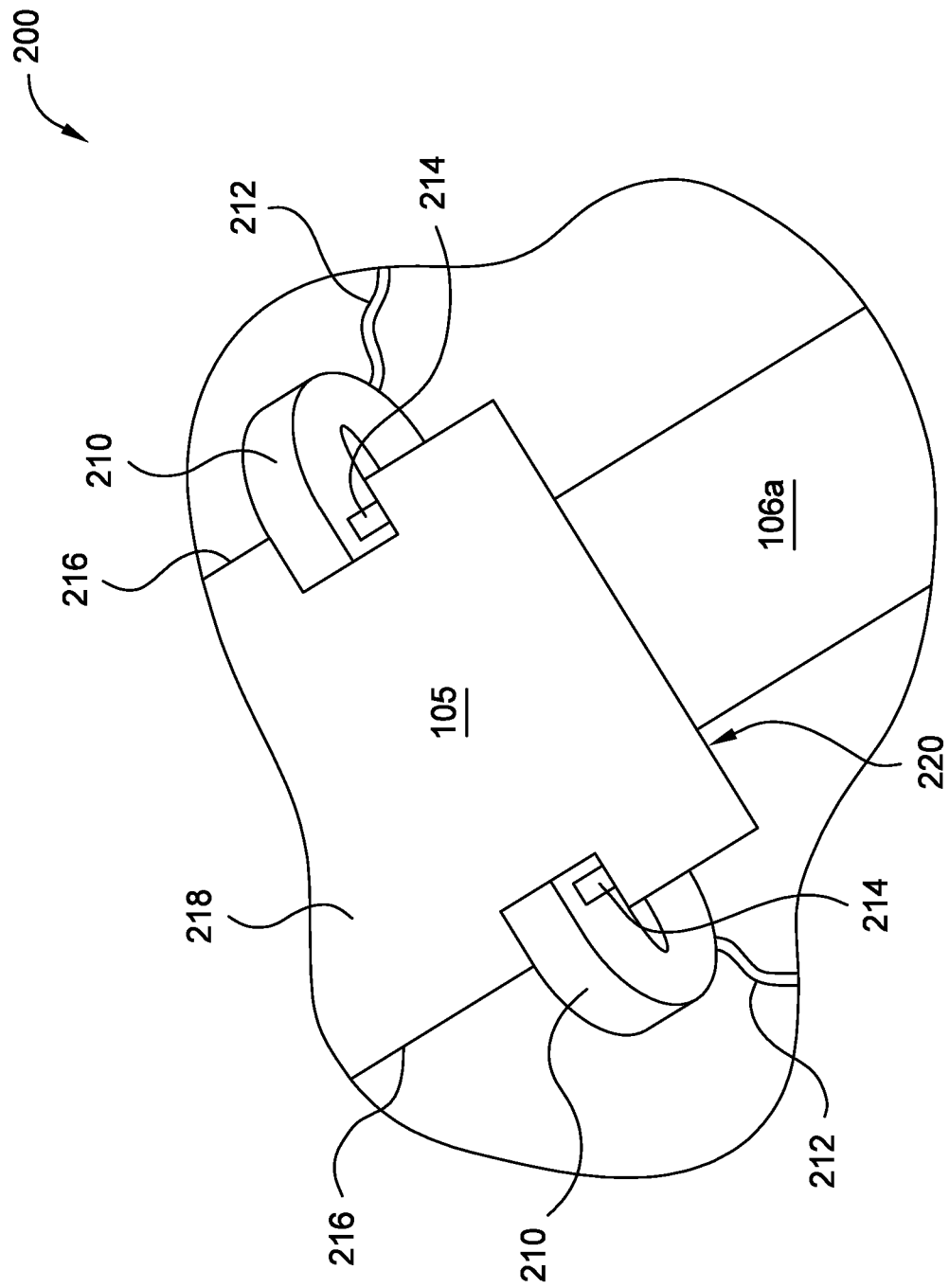
FIG. 2 is a pair of detectors of the inspection system, according to embodiments described herein.

FIG. 2 is a pair of detectors 210 of the inspection system 100. The detectors 210 are positioned in one or both of the metrology units 107a, 107b. In one embodiment, which can be combined with other embodiments described herein, the detector 210 is a U-shaped detector. A conveyor, such as the conveyor 106a, is adapted to transfer a wafer 105 relative to and within an interior of the detectors 210 to facilitate inspection of the wafer by detectors 210. The cables 212 may facilitate the transfer of power and data with respect to the detectors 210. Each detector 210 may include one or more light sources 214. The detector 210 includes one or more imaging devices, such as CCD cameras. For example, opposite lateral edges 216 of the wafer 105 may be positioned within opposing detectors 210 for inspection of each lateral edge 216. The detectors 210 are configured to capture images of the edges 216, a top surface 218, and a bottom surface 220 of the wafer 105. For example, the detectors 210 capture images of defects in the wafer 105. Due to the U-shape, defects that do not have any impact on the top surface 218 or bottom surfaces 220 can be detected, in addition to defects that are located on the top surface 218 or bottom surface 220 adjacent the edges 216 of the wafer 105.

Upon capturing images of the edges of the wafer 105, the images are transferred via the cables 212 to the controller 117. A software program is initialized to analyze the images. The images of the edges of the wafer 105 are analyzed to detect and analyze chips or other defects in the edges 216 of the wafer. The software program described herein allows for enhanced detection of the defects and enhanced identification of the defects in the wafer 105. As such, reduction of undetected defects in the wafer 105 will be achieved.

Figure 3:
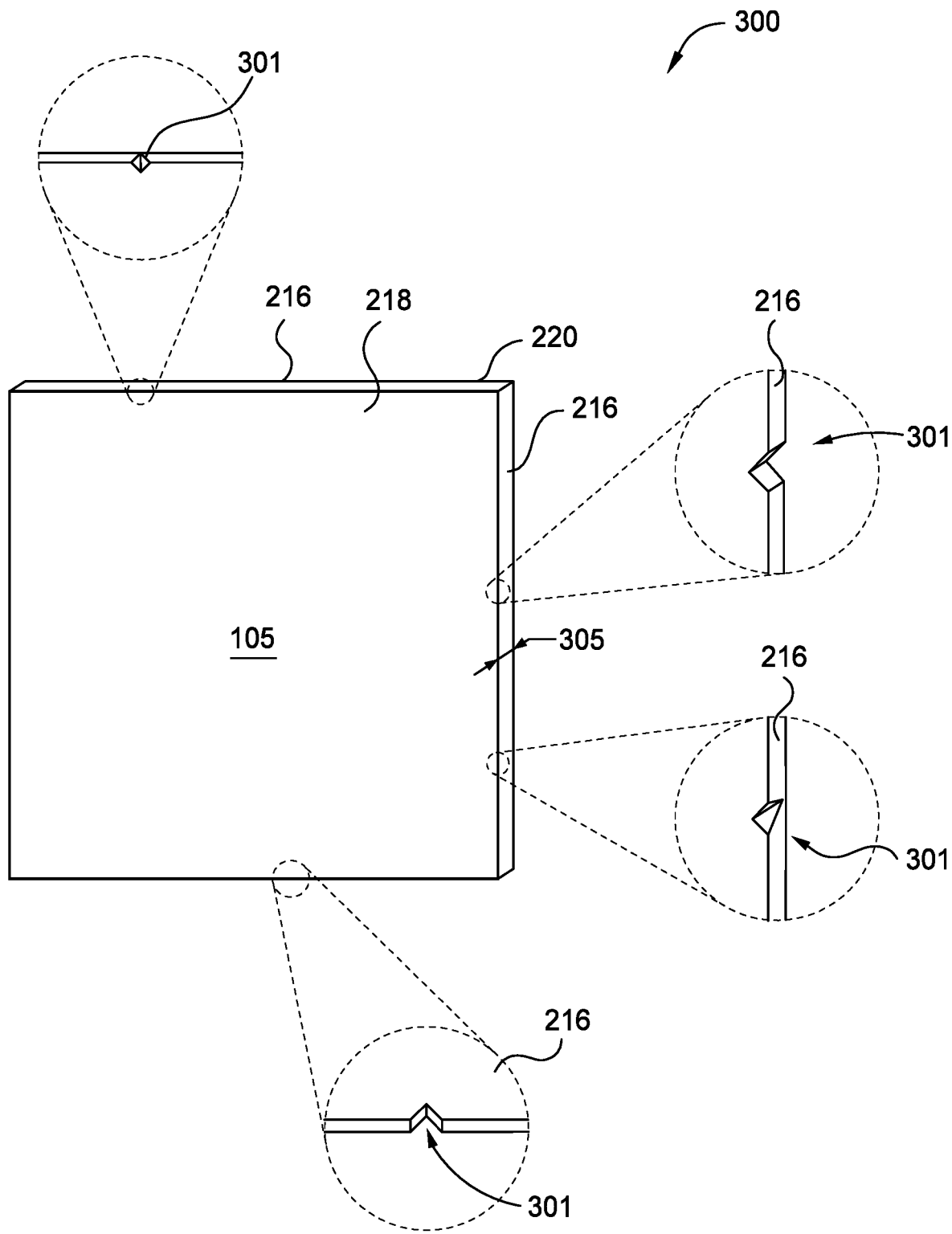
FIG. 3 is a schematic, isometric view of one example of a wafer suitable for inspection by the inspection system, according to embodiments described herein.

FIG. 3 is a schematic, isometric view of one example of a wafer suitable for inspection by the inspection system 100. The wafer 105 includes defects 301 formed on at least the edges 216 of the wafer 105. Defects 301 includes chips, cracks, breaks, and other visual defects. The defects 301 are formed on the wafer 105 in the course of the fabrication process. For example, the defects 301 may be formed from slicing a brick of silicon into an individual wafer 105. The brick may be a multi-crystalline or mono-crystalline silicon brick having a cuboid shape. In another example, the defects 301 are formed on the edge 216 during routing processing and handling of the wafer 105 or form routine defects during the manufacturing process. These defects include defects 301 on the top surface 218 and the bottom surface 220 along the edges 216, defects 301 on the top surface 218 or the bottom surface 220 along the edges 216, or defects 301 on only the edges 216. The defects 301 disposed on a single wafer 105 are often difficult to detect due to the size of the defects 301 relative to small height of the edge 216 of the wafer 105 (i.e., wafer thickness) and large size of the wafer 105. The number of defects 301 that may occur on each edge 216 are not limited. For example, the wafer 105 has a thickness 305 about 200 μm.

Figure 4:
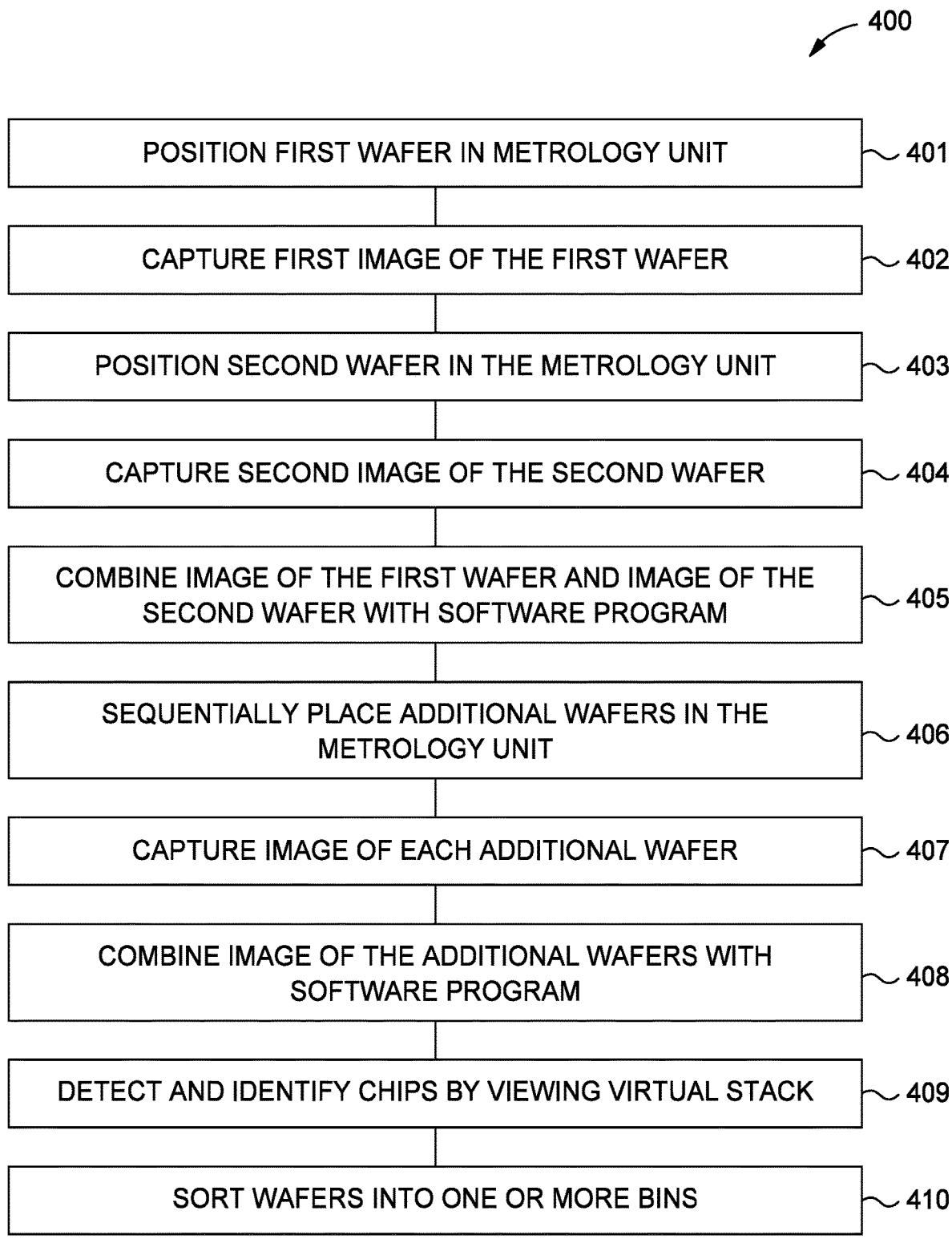
FIG. 4 is a flow diagram of a method for detecting defects along an edge of a wafer, according to embodiments described herein.
Figure 5:
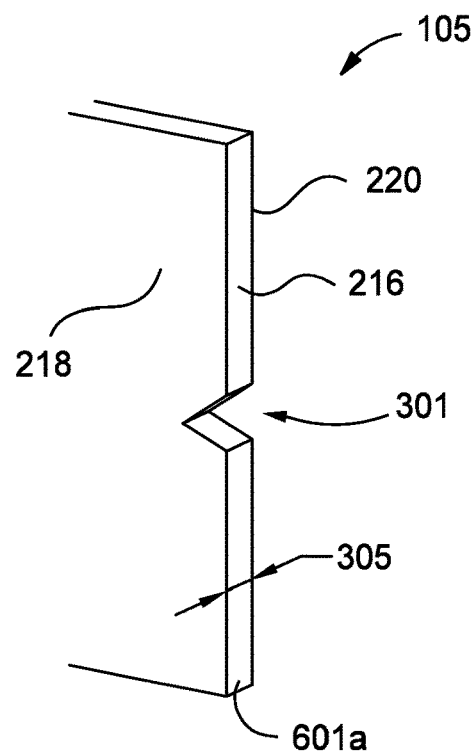
FIG. 5 is a schematic, side isometric view of a first wafer, according to embodiments described herein.
Figure 6:
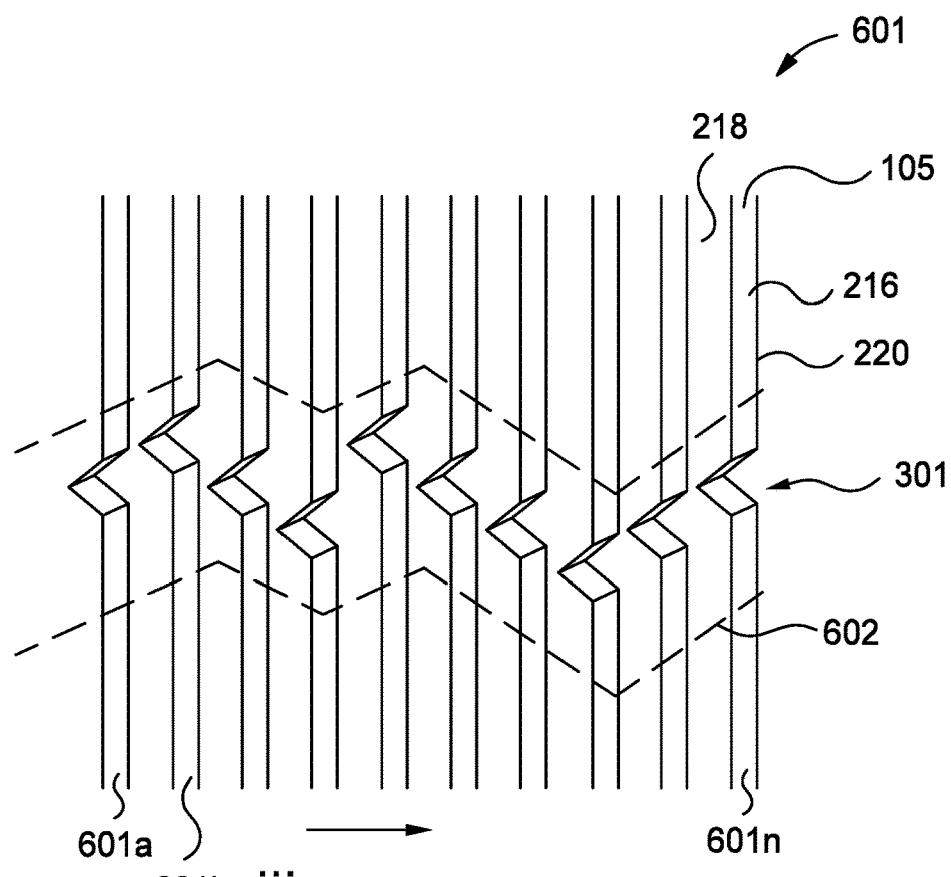
FIG. 6 is a schematic, side isometric exploded view of multiple wafers arranged in order of testing, according to embodiments described herein.
Figure 7:
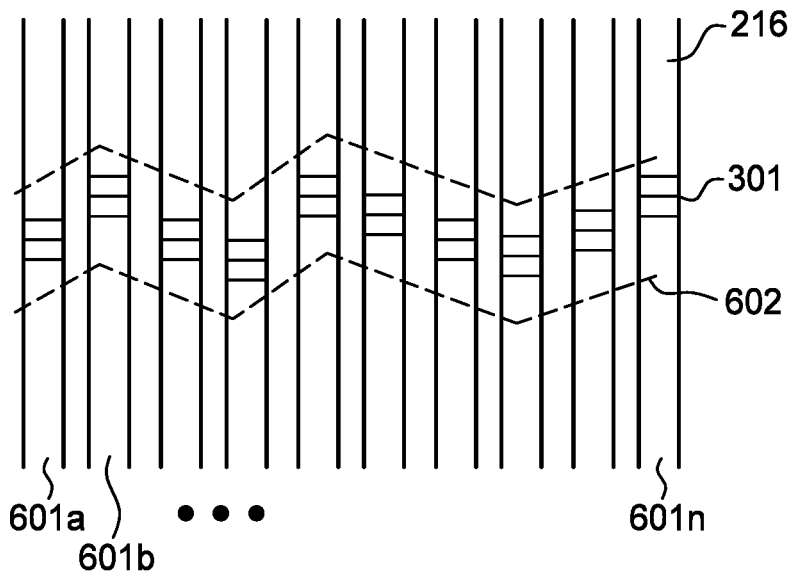
FIG. 7 is a schematic, front exploded view of multiple wafers arranged in order of testing, according to embodiments described herein.
Figure 8:
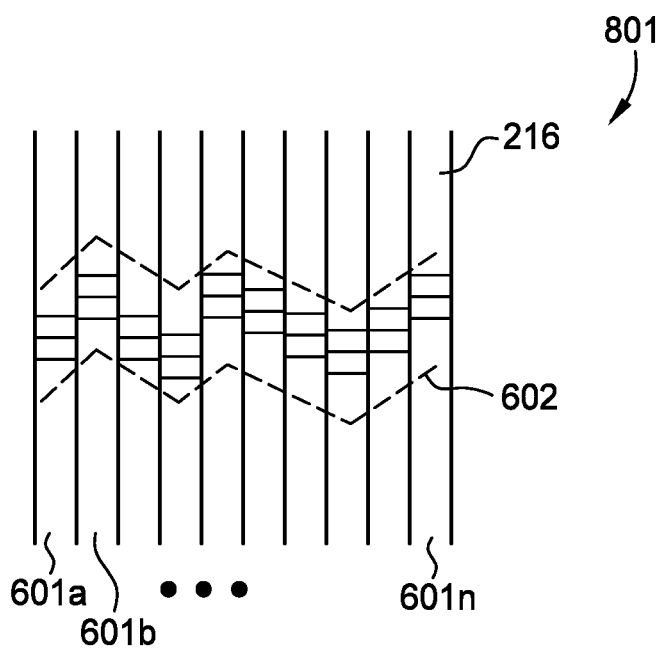
FIG. 8 is a schematic, front view of images of multiple wafers arranged in a virtual stack, according to embodiments described herein.

FIG. 4 is a flow diagram of a method for detecting defects along an edge of a wafer. The method 400 is described with reference to FIG. 5-FIG. 8. FIG. 5 is a schematic, side isometric view of a first wafer 601a. The first wafer 601a is similar to the wafer 105 as described above. The first wafer 601a includes at least one defect 301 on at least the edge 216. When viewing the first wafer 601a, it may be difficult to identify the defect 301. FIG. 6 is a schematic, side isometric exploded view of multiple wafers arranged in order of testing. The wafers 601a . . . 601n are similar to the wafers 105 as described above. The wafers 601a . . . 601n are arranged sequentially in the order of testing. Sequentially is defined as the wafers are in an order corresponding to their positions in the brick prior to slicing the brick. The wafers 601a . . . 601n may include at least one defect 301 on at least the edge 216. In FIG. 6, all of the wafers 601a . . . 601n include at least one defect 301 formed on the edge 216 of each wafer. The method 400 is compatible with any workpiece having an edge to inspect. Further, a round workpiece or wafer can be inspected by rotating one or both of the wafer or the detector. When the wafers 601a . . . 601n have defects 301 in similar positons along each edge 216, a pattern 602 of the defects 301 can be identified when viewing the edges 216 sequentially. The pattern 602 of defects 301 in close proximity will lead to improved detection of the defects 301. FIG. 7 is a schematic, front exploded view of multiple wafers arranged in order of testing. As shown, the pattern 602 can be viewed when viewing the wafers 601a . . . 6601n sequentially. FIG. 8 is a schematic, front view of images of multiple wafers arranged in a virtual stack 801. The virtual stack 801 includes images of the wafers 601a . . . 601n arranged sequentially for improved detection of the defects 301 when viewing the images during inspection.

To facilitate explanation, the method 400 is described in conjunction with the inspection system 100 of FIG. 1, and more specifically, the metrology unit 107a of FIG. 1. The method 400, is not limited to the inspection system 100 and is compatible with other inspection systems. The method 400 is directed to detecting defects 301 on edges 216 of wafers. Prior to operation 401, the wafers 601a . . . 601n may be sliced from a brick by a wire saw, or other device capable of slicing an individual wafer 601a . . . 601n from the brick. The brick may also be processed in a squaring tool to bring the brick into tolerances for parallelism. Each of the wafers 601a . . . 601n are sequentially ordered based on positon in the brick.

Prior to the method 400, a first wafer 601a is positioned in a metrology unit 107a. The first wafer 601a is placed on a conveyor 106a in the inspection system 100. In one example, the first wafer 601a is moved relative to the metrology unit 107a in a continuous manner as inspection occurs. The transfer robot 104 in the front end 101 is adapted to transfer the first wafer 601a from one or more cassettes 109 positioned within the front end 101 to the conveyor 106a and to the metrology unit 107a and the metrology unit 107b.

At operation 401, an image of the edge 216 of the first wafer 601a is captured. In one example, one or more detectors 210 in the metrology unit 107a are configured to provide light via one or more light sources 214 and capture the images of the first wafer 601a. In another example, the image of the first wafer 601a may be captured by any suitable image capture device of the detector 210, such as a line scan camera. The detectors 210 capture the image of the edge 216 of the first wafer 601a. In one example, the detectors 210 inspect an area extending from the edge 216 to about 15 mm into the top surface 218 and the bottom surface 220. In some embodiments, the detectors 210 may also capture images of the top surface 218 and the bottom surface 220. For example, the pixel size of the image is about 15 µm. The image of the edge 216 of the first wafer 601a is provided to the memory 122 of the controller 117. The controller 117 is configured to run a defect detection software. As shown in FIG. 5, the first wafer 601a includes a defect 301 on the edge 216. When viewing the image of the first wafer 601a with the defect detection software, it is often difficult to identify the individual defect 301.

At operation 402, the first wafer 601a is inspected in the metrology unit 107b. The metrology unit 107b collects test results based on testing the first wafer 601a. The test results of the first wafer 601a is provided to the controller 117. The inspection processes include thickness measurement, impurity measurements (e.g., percentage of impurities), crystal dislocation measurements, analysis of the geometry and surface properties of the wafer 105, saw mark detection (e.g., saw mark depth and location), and may inspect and identify saw marks including groove, step, and double step.

Prior to the operation 403 of the method 400, a second wafer 601b is positioned in the metrology unit 107a. The second wafer 601b is the wafer sequentially next to the first wafer 601a in the brick. The second wafer 601b is placed on the conveyor 106a in the inspection system 100. In one example, the second wafer 601b is moved relative to the metrology unit 107a in a continuous manner as inspection occurs. The transfer robot 104 in the front end 101 is adapted to transfer the second wafer 601b from one or more cassettes 109 positioned within the front end 101 to the conveyor 106a.

At operation 403, an image of the edge 216 of the second wafer 601b is captured. In one example, one or more detectors 210 in the metrology unit 107a are configured to provide light via one or more light sources 214 and capture the images of the second wafer 601b. In another example, the image of the second wafer 601b may be captured by any suitable image capture device of the detector 210, such as a line scan camera. The detectors 210 capture the image of the edge 216 of the second wafer 601b. The image of the second wafer 601b is provided to the memory 122 of the controller 117. The controller 117 is configured to run a defect detection software.

At operation 404, the second wafer 601b is inspected in the metrology unit 107b. The metrology unit 107b collects test results based on testing the second wafer 601b. The test results of the second wafer 601b is provided to the controller 117. The inspection processes include thickness measurement, impurity measurements (e.g., percentage of impurities), crystal dislocation measurements, analysis of the geometry and surface properties of the wafer 105, saw mark detection (e.g., saw mark depth and location), and may inspect and identify saw marks including groove, step, and double step.

At operation 405, the defect detection software combines the image of the edges 216 of each of the first wafer 601a and of the second wafer 601b to form a virtual stack 801. The defect detection software combines the image of the edges 216 of the first wafer 601a and the image of the second wafer 601b such that at least the edges 216 of the respective first wafer 601a and the second wafer 601b are positioned side-by-side in a virtual stack 801, as shown in FIG. 8. The combination of the image of the first wafer 601a and the image of the second wafer 601b may be performed by the defect detection software to form the virtual stack 801.

As shown in FIG. 6 and FIG. 8, viewing the pattern 602 of the defects 301 improves identification of the defects 301. However, during the process of inspecting the wafers 601a ... 601n, physically placing the wafers in a stack will decrease throughput. The method 400 described herein provides for forming the virtual stack 801 with defect detection software to view the edges 216 sequentially in a virtual manner.

Prior to the optional operation 406, additional wafers (e.g., a third wafer 601c ... 601n) may be optionally placed sequentially in the metrology unit 107a. The additional wafers are placed on the conveyor 106a in the inspection system 100. The additional wafers are moved relative to the metrology unit 107a in a continuous manner as inspection occurs. The number of the additional wafers is not limited. Alternatively, additional wafers are not required to be placed in the inspection system 100. The transfer robot 104 in the front end 101 is adapted to transfer the additional wafers 601c from one or more cassettes 109 positioned within the front end 101 to the conveyor 106a.

At optional operation 406, an image of the edges 216 of the additional wafers (e.g., a third wafer 601c ... 601n) is captured. In one example, one or more detectors 210 in the metrology unit 107a are configured to provide light via one or more light sources 214 and capture the images of the edges 216 of the additional wafers. In another example, the image of the additional wafers may be captured by any suitable image capture device of the detectors 210, such as a line scan camera. The detectors 210 allow for imaging of the edges 216 of each of the additional wafers. The images of the additional wafers are provided to the memory 122 of the controller 117.

At optional operation 407, the additional wafers are inspected in the metrology unit 107b. The metrology unit 107b collects test results based on testing the additional wafers. The test results of the additional wafers are provided to the controller 117. The inspection processes include thickness measurement, impurity measurements (e.g., percentage of impurities), crystal dislocation measurements, analysis of the geometry and surface properties of the wafer 105, saw mark detection (e.g., saw mark depth and location), and may inspect and identify saw marks including groove, step, and double step.

At optional operation 408, the defect detection software combines the images of the additional wafers. The images are combined, as shown in FIG. 8, to show the edges 216 in the virtual stack 801. In one example, the defect detection software continuously combines the images of the additional wafers sequentially with the previous images to form the virtual stack 801. For example, the third wafer 601c is combined with the first wafer 601a and the second wafer 601b such that at least the edges 216 of the respective first wafer 601a, the second wafer 601b, and each additional wafer (e.g., 601c . . . 601n) are positioned side-by-side in the virtual stack 801.

In another example, the defect detection software continuously combines the images of the additional wafers, while removing images that were previously combined such that a predetermined number of images form the virtual stack 801 of images. For example, if the virtual stack 801 of images is to include only ten images, as an image of an eleventh wafer 601k is added to the virtual stack 801, the first wafer 601a would be removed from the virtual stack 801. The predetermined number of images is less than or equal to the number of wafers between the sorting unit 103 and the inspection unit 102. As such, the virtual stack 801 will always have the predetermined number of images in the virtual stack 801.

The combination of the images of the edges 216 to form the virtual stack 801 may be performed by the defect detection software. In some embodiments, which can be combined with other embodiments described herein, images from each edge 216 of a wafer can be pieced together to form a single image of the edges 216. The image processor will be run to detect and identify the defects 301 on each of the edges 216 of each wafer in the virtual stack 801. As each wafer is either kept or disposed based on the number of defects 301, the identification and detection of the defects 301 must occur prior to each wafer reaching the sorting unit 103. As such, the predetermined number of images in the virtual stack 801 is dependent on factors such as speed of the conveyor 106a and distance of the metrology unit 107a to the sorting unit 103.

At operation 409, defects 301 are detected and identified by viewing the virtual stack 801. The virtual stack 801 of at least two wafers (e.g., the wafers 601a . . . 601n) is inspected to detect and identify the defects 301. In one example, the defects 301 are identified with the image processor. As shown in FIG. 8, the edges 216 of sequential wafers from the brick (e.g., the first wafer 601a and the second wafer 601b) are positioned adjacent to each other. In some embodiments, the defects 301 are created on the brick prior to slicing each wafer 601a . . . 601n. As such, the adjacent wafers (e.g., the first wafer 601a and the second wafer 601b) will have defects 301 in close proximity to each other. For example, as shown in FIG. 8, the first wafer 601a and the second wafer 601b have defects 301 in similar positons along each edge 216. Therefore, the pattern 602 of the defects 301 can be identified in the virtual stack 801 with the image processor. The pattern 602 is indicative of one or more defects. The image processor is capable of analyzing the pattern and identifying the defects 301 on the edges 216 in the pattern 602. The image processor is also capable of determining which wafer includes the identified defect 301. The pattern 602 of defects 301 in close proximity will lead to improved detection of the defects 301 by the image processor. The defect detection software virtually combines the individual images of the edges 216 to form the virtual stack 801 that dramatically improves identification and detection of defects 301 that would otherwise be difficult to detect from a single individual image of an edge. The defect detection software will send the defect data identifying the defects 301 of the wafers 601a . . . 601n, in conjunction with information obtained during any other inspection processes performed in the metrology unit 107b to the controller 117.

In another example, the defects 301 are identified manually by viewing the images with the defect detection software. In yet another embodiment, machine learning engines and techniques are utilized to analyze the virtual stack 801 to identify the defects 301. When viewing the first wafer 601a, it may be difficult to identify the defect 301, however the pattern 602 of defects 301 will improve identification. The machine learning techniques are utilized to advantageously improve the identification of defects 301 within the pattern 602 by implementing iterative learning. For example, the image processor will extract features (e.g., unidentified chips or areas of interest) from the images. The image processor will provide the features into a neural network. The output of the neural network is utilized to determine if there is a defect 301 in the edges 216 of each of the wafers 601a . . . 601n. Additionally, the features can be input to the neural network to predict lifetime wear on tools utilized during wafer processing. For example, the neural network can utilized machine learning to predict when tools (e.g., squaring tool, wiresaw, or other device capable of slicing an individual wafer) need to be serviced.

In some embodiments, if the wafers 601a . . . 601n are not placed sequentially through the inspection system 100, the defect detection software sorts the images such that the images are in sequential order. To be able to sort the images, the wafers may be labeled with their respective positions in the brick prior to slicing.

At operation 410, each of the wafers 601a . . . 601n are sorted into one or more bins 115 in the sorting unit 103. The wafers 105 are sorted into the bins 115 according to the test results obtained during the inspection processes performed in the metrology unit 107b. The wafers 601a . . . 601n are respectively stacked with wafers having common test results. For example, the operation 401 includes respectively stacking the first wafer and the second wafer with wafers having common test data. In some embodiments, the wafers can be additionally sorted based on the identified defects 301.

In summation, a defect detection system and method suitable for detecting defects on an edge of a wafer are described herein. The method described herein allows for improved defect detection that will increase defect identification and detection, without sacrificing throughput. The method includes combining images of the edges of each wafer in a virtual stack. The virtual stack allows for a pattern indicative of one or more defects to be readily identified. The pattern of defects in close proximity to each other enables improved detection of the defects that would conventionally be difficult to detect from a single image of one edge of a wafer.

What is claimed is:

1. A method for inspecting a wafer, the method comprising:
    moving a first wafer through a metrology unit;
    capturing a first image of an edge of the first wafer;
    moving a second wafer through the metrology unit after the first wafer;
    capturing a second image of an edge of the second wafer;
    combining the first image of the edge of the first wafer and the second image of the edge of the second wafer to form a virtual stack of the first image and the second image positioned side-by-side; and
    identifying one or more defects on the edge of the first wafer or the edge of the second wafer based on the virtual stack.

2. The method of claim 1, further comprising:
    moving additional wafers through the metrology unit after the second wafer;
    capturing additional images of an edge of each of the additional wafers; and
    adding the additional images to the virtual stack.

3. The method of claim 2, wherein the additional wafers are provided to the metrology unit sequentially relative to position in a brick from which the first wafer and the second wafer were sliced, wherein the additional images are used to find a pattern indicative of one or more defects.

4. The method of claim 1, wherein the metrology unit is configured to perform inspection processes to obtain test data of the first wafer and the second wafer, the inspection processes including thickness measurement, impurity measurements, crystal dislocation measurements, analysis of geometry and surface properties, and saw mark detection.

5. The method of claim 4, further comprising sorting the first wafer and the second wafer according to the test data obtained in the inspection processes.

6. The method of claim 5, wherein the sorting further comprises:
stacking the first wafer with other wafers having common test data.

7. The method of claim 1, further comprising providing the first wafer and the second wafer to the metrology unit with a transfer robot, wherein the transfer robot moves the first wafer and the second wafer to the metrology unit from one or more cassettes.

8. The method of claim 1, wherein the one or more defects are identified by viewing the virtual stack to find a pattern of the one or more defects.

9. The method of claim 1, further comprising utilizing a machine learning technique to identify the one or more defects individually from within a pattern of the one or more defects.

10. The method of claim 1, further comprising capturing the first image and the second image while the first wafer and the second wafer are moving.

11. A wafer inspection system, comprising:
a metrology unit comprising a first camera configured to capture an image of an edge of each of individual wafers moving through the metrology unit;
a controller in communication with the first camera, wherein the controller is configured to:
combine the images of the edges of the individual wafers obtained by the first camera to form a virtual stack of the images positioned side-by-side; and
identify one or more defects on the individual wafers based on the virtual stack.

12. The wafer inspection system of claim 11, wherein the first camera is disposed in one or more detectors disposed along a first conveyor and configured to capture images of a top surface, a bottom surface, and edges of each the individual wafers.

13. The wafer inspection system of claim 12, wherein one or more of the detectors includes one or more light sources and one or more imaging devices.

14. The wafer inspection system of claim 11, further comprising a second camera disposed in a second metrology unit, wherein the second metrology unit is configured to perform inspection processes to obtain test data of the individual wafers, the inspection processes including thickness measurement, impurity measurements, crystal dislocation measurements, analysis of geometry and surface properties, and saw mark detection.

15. The wafer inspection system of claim 14, wherein the controller is further configured to sort the individual wafers according to the test data obtained from the second camera.

16. The wafer inspection system of claim 11, further comprising a sorting unit, wherein a number of the images in the virtual stack is less than a number of wafers between the first camera and the sorting unit.

17. The wafer inspection system of claim 11, wherein the controller is further configured to capture images of all four edges of the individual wafers and combine the images of all four edges in the virtual stack.

18. The wafer inspection system of claim 11, wherein the one or more defects are identified by viewing the virtual stack to find a pattern of the one or more defects.

19. A non-transitory computer-readable medium storing instructions that, when executed by a processor coupled to an inspection system, cause the inspection system to:
move a first wafer through a metrology unit;
capture a first image of an edge of the first wafer;
move a second wafer through the metrology unit after the first wafer;
capture a second image of an edge of the second wafer;
combine the first image of the edge of the first wafer and the second image of the edge of the second wafer to form a virtual stack of the first image and the second image positioned side-by-side; and
identify one or more defects on the edge of the first wafer or the edge of the second wafer based on the virtual stack.

20. The non-transitory computer-readable medium of claim 19, that further cause the inspection system to:
move the first wafer and the second wafer through a second metrology unit, wherein the second metrology unit is configured to perform inspection processes to obtain test data of the first wafer and the second wafer, the inspection processes including thickness measurement, impurity measurements, crystal dislocation measurements, analysis of geometry and surface properties, and saw mark detection; and
sort the first wafer and the second wafer according to the test data obtained from the second metrology unit.

* * * * *